US012628268B2

(12) United States Patent
Liu et al.

(10) Patent No.: US 12,628,268 B2
(45) Date of Patent: May 12, 2026

(54) CONDUCTIVE FILM AND DISPLAY PANEL

(71) Applicant: TCL China Star Optoelectronics Technology Co., Ltd., Shenzhen (CN)

(72) Inventors: Xin Liu, Shenzhen (CN); Hongyuan Xu, Shenzhen (CN); Juncheng Xiao, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 1059 days.

(21) Appl. No.: 17/770,107

(22) PCT Filed: Apr. 15, 2022

(86) PCT No.: PCT/CN2022/087026
§ 371 (c)(1),
(2) Date: Oct. 5, 2023

(87) PCT Pub. No.: WO2023/184593
PCT Pub. Date: Oct. 5, 2023

(65) Prior Publication Data
US 2024/0147607 A1 May 2, 2024

(30) Foreign Application Priority Data

Mar. 28, 2022 (CN) ......................... 202210314291.6

(51) Int. Cl.
| | |
|---|---|
| *H05K 1/02* | (2006.01) |
| *H05K 1/03* | (2006.01) |
| *H05K 1/18* | (2026.01) |
| *H05K 1/183* | (2026.01) |

(52) U.S. Cl.
CPC ............. *H05K 1/028* (2013.01); *H05K 1/183* (2013.01); *H05K 1/0313* (2013.01); *H05K 2201/10128* (2013.01); *H05K 2201/10287* (2013.01)

(58) Field of Classification Search
None
See application file for complete search history.

(56) References Cited

U.S. PATENT DOCUMENTS

| | | | |
|---|---|---|---|
| 2018/0247992 A1* | 8/2018 | Cho | .................... H01L 23/5283 |
| 2018/0301520 A1 | 10/2018 | Jin et al. | |
| 2019/0237490 A1* | 8/2019 | Hu | ........................ H10D 30/031 |
| 2021/0335971 A1 | 10/2021 | Zhao | |

FOREIGN PATENT DOCUMENTS

| | | |
|---|---|---|
| CN | 206332028 | 7/2017 |
| CN | 108257971 | 7/2018 |
| CN | 108695343 | 10/2018 |
| CN | 108770184 | 11/2018 |
| CN | 109859625 | 6/2019 |
| CN | 110033900 | 7/2019 |
| CN | 210112367 | 2/2020 |
| CN | 114093251 | 2/2022 |
| JP | 2019-075491 | 5/2019 |
| KR | 10-2015-0078350 | 7/2015 |

* cited by examiner

*Primary Examiner* — Timothy J Thompson
*Assistant Examiner* — John B Freal

(57) ABSTRACT

A conductive film includes a substrate and a conductive layer. The conductive layer is disposed on the substrate and comprises a plurality of wires spaced apart and parallel to each other. At least one of the wires is provided with a stress dispersing structure. The stress dispersing structure is configured to disperse a stress generated when the conductive film is bent. A display panel comprises the conductive film.

19 Claims, 5 Drawing Sheets

CONDUCTIVE FILM AND DISPLAY PANEL

RELATED APPLICATIONS

This application is a National Phase of PCT Patent Application No. PCT/CN2022/087026 having International filing date of Apr. 15, 2022, which claims the benefit of priority of Chinese Patent Application No. 202210314291.6 filed on Mar. 28, 2022. The contents of the above applications are all incorporated by reference as if fully set forth herein in their entirety.

FIELD AND BACKGROUND OF THE INVENTION

The present disclosure relates to the technical field of display, and particularly to a conductive film and a display panel.

Light-emitting diodes (LEDs) are common light-emitting devices that emit light through energy released by recombination of electrons and holes, and are widely used in the field of lighting. Mini-LEDs are new LED display technology derived from small-pitch LEDs, also known as sub-millimeter light-emitting diodes. Mini-LEDs are a leading display technology in the industry. Mini-LEDs with multi-zone local dimming technology can achieve a high dynamic contrast ratio. Mini-LEDs with high color gamut have a display effect comparable to that of organic light-emitting diodes (OLEDs), and have inherent advantages over organic light-emitting diodes in terms of service life.

Currently, with development of Mini-LED direct-display large-screen technology, for better visual effects, requirements for seams between single panels are getting higher, and gradually tend to zero seam technology. Bending properties of conductive films play a key role in zero seam technology. The bending properties of current conductive films are low, and problems such as cracks are prone to occur during a bending process.

SUMMARY OF THE INVENTION

A purpose of the present disclosure is to provide a conductive film and a display panel, which can solve a problem that current conductive films are prone to cracks during a bending process due to their low bending properties.

In order to solve the above problem, the present disclosure provides a conductive film comprising a substrate and a conductive layer. The conductive layer is disposed on the substrate and comprises a plurality of wires spaced apart and parallel to each other. At least one of the wires is provided with a stress dispersing structure. The stress dispersing structure is configured to disperse a stress generated when the conductive film is bent.

In an embodiment, a surface of each of the wires facing the substrate is a flat surface.

In an embodiment, the stress dispersing structure comprises a first stress dispersing structure. The first stress dispersing structure comprises a plurality of first through holes arranged at intervals in an extending direction of the wires and vertically penetrating the at least one of the wires.

In an embodiment, the stress dispersing structure further comprises a second stress dispersing structure. The second stress dispersing structure comprises a plurality of second through holes arranged at intervals in the extending direction of the wires and vertically penetrating the at least one of the wires.

In an embodiment, the first through holes and the second through holes are staggered.

In an embodiment, a projected shape of each of the first through holes and the second through holes on the substrate is an ellipse, a circle, a rounded triangle, or a rounded rectangle.

In an embodiment, a surface of each of the wires facing the substrate is a curved surface.

In an embodiment, the stress dispersing structure comprises a plurality of upper convex parts and a plurality of lower concave parts connected end to end.

In an embodiment, the conductive film further comprises a protective layer disposed on a surface of the conductive layer away from the substrate.

In order to solve the above problem, the present disclosure further provides a display panel comprising the conductive film provided by the present disclosure. The conductive film is configured to electrically connect at least two subcomponents of the display panel. The conductive film is a chip on film (COF) or a flexible printed circuit (FPC).

In the present disclosure, at least one of the wires is provided with the stress dispersing structure. The stress dispersing structure disperses the stress generated when the conductive film is bent, which prevents cracks in the wires, inhibits spread of cracks, improves bending resistance of the conductive film, and prolongs a service life of the conductive film.

BRIEF DESCRIPTION OF THE SEVERAL VIEWS OF THE DRAWINGS

In order to more clearly illustrate technical solutions in embodiments of the present disclosure, a brief description of accompanying drawings used in a description of the embodiments of the present disclosure will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Figure 1:
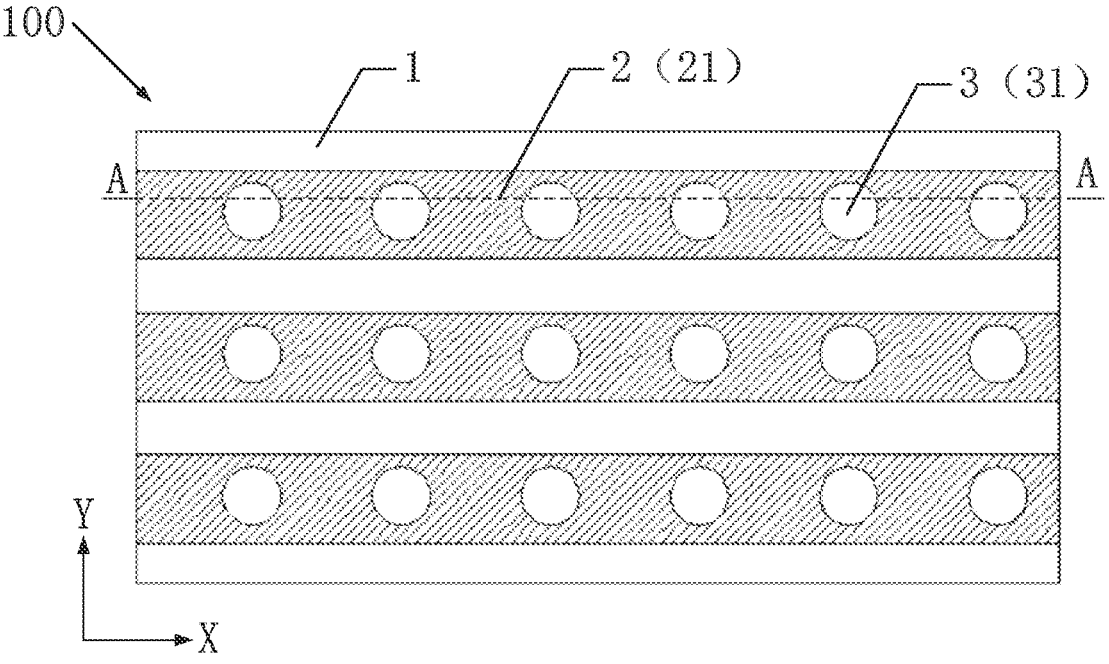
FIG. 1 is a schematic plan view of a conductive film according to Embodiment 1 of the present disclosure.

Preferred embodiments of the present disclosure are described in detail below with reference to the accompanying drawings, so as to fully introduce a technical content of the present invention to those skilled in the art, to demonstrate that the present invention can be implemented, thereby making the technical content of the present invention clearer, and making it easier for those skilled in the art to understand how to implement the present invention. However, the present invention can be embodied by many different embodiments. The claimed scope of the present invention is not limited to the embodiments described herein. The description of the embodiments below is not intended to limit the claimed scope of the present invention.

Directional terms mentioned in the present disclosure, such as "above", "below", "front", "back", "left", "right", "inside", "outside", "side", are merely used to indicate the direction of the accompanying drawings. The directional terms used herein are used to explain and illustrate the present disclosure, rather than to limit the claimed scope of the present disclosure.

In the accompanying drawings, components with a same structure are indicated by similar reference numerals. Components that are similar in structure or function are indicated by a same reference numeral. In addition, for ease of understanding and description, a size and thickness of each component shown in the accompanying drawings are arbitrarily shown, and the size and thickness of each component are not limited in the present disclosure.

Embodiment 1

As shown in FIG. 1, the present disclosure provides a display panel. The display panel comprises a conductive film 100. The conductive film 100 is configured to electrically connect at least two subcomponents of the display panel. In this embodiment, the conductive film 100 is configured to electrically connect bonding terminals and a printed circuit board. The conductive film 100 may be a chip on film (COF) or a flexible printed circuit (FPC). In this embodiment, the conductive film 100 is a COF.

As shown in FIG. 1, the conductive film 100 comprises a substrate 1, a conductive layer 2, a stress dispersing structure 3, and a protective layer 4.

The substrate 1 is made of one or more of glass, polyimide, polycarbonate, polyethylene terephthalate, and polyethylene naphthalate. In this embodiment, the substrate 1 is made of polyimide, so the substrate 1 can have better impact resistance.

The conductive layer 2 is disposed on the substrate 1. The conductive layer 2 comprises a plurality of wires 21 that are spaced apart and parallel to each other. In this embodiment, the wires 21 are made of copper. In other embodiments, the wires 21 may be made of other metal materials. In this embodiment, the wires 21 extend in a first direction X, and are arranged at intervals in a second direction Y perpendicular to the first direction X.

At least one of the wires 21 is provided with a stress dispersing structure 3. The stress dispersing structure 3 is configured to disperse a stress generated when the conductive film 100 is bent. The stress dispersing structure 3 disperses the stress generated when the conductive film 100 is bent, which prevents cracks in the wires 21, inhibits spread of cracks, improves bending resistance of the conductive film 100, and prolongs a service life of the conductive film 100.

Figure 2:
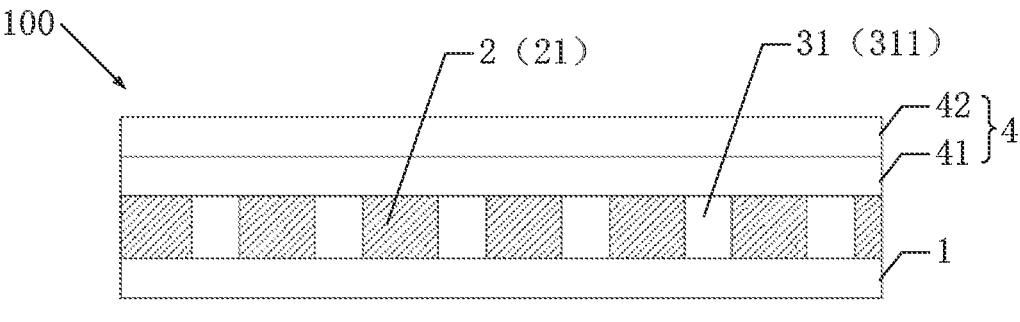
FIG. 2 is a cross-sectional schematic diagram of the conductive film of FIG. 1 along a line A-A.

As shown in FIG. 2, in this embodiment, a surface of each of the wires 21 facing the substrate 1 is a flat surface.

As shown in FIG. 1 and FIG. 2, in this embodiment, the stress dispersing structure 3 comprises a first stress dispersing structure 31. The first stress dispersing structure 31 comprises a plurality of first through holes 311 arranged at intervals in an extending direction (the X direction) of the wires 21 and vertically penetrating the at least one of the wires 21.

A projected shape of each of the first through holes 311 on the substrate 1 is an ellipse, a circle, a rounded triangle, or a rounded rectangle. In this embodiment, the projected shape of each of the first through holes 311 on the substrate 1 is a circle.

As shown in FIG. 2, the protective layer 4 is disposed on a surface of the conductive layer 2 away from the substrate 1. The protective layer 4 comprises a first protective layer 41 and a second protective layer 42.

The first protective layer 41 is disposed on the surface of the conductive layer 2 away from the substrate 1. In this embodiment, the first protective layer 41 may be made of Sn, and is mainly configured to prevent the conductive layer 2 from being oxidized.

The second protective layer 42 is disposed on a surface of the first protective layer 41 away from the substrate 1. In this embodiment, the second protective layer 42 may be a waterproof coating, and is mainly configured to isolate moisture.

After stress simulation by a simulation system, it can be found that a stress distribution of a wire without through holes in the prior art is relatively uniform. A stress of a bending center of the wire 21 of this embodiment is less than that of the wire without the through holes. However, the wire 21 has relatively obvious stress concentration around the first through holes 311, and the wire 21 has a larger stress value at a periphery of each of the first through holes 311 perpendicular to the extending direction of the wire 21. Furthermore, in this embodiment, a stress value of a part of an inorganic layer under each of the first through holes 311 of the wire 21 is also larger. The larger the diameter of the first through holes 311 is, the greater the average stress value is. The smaller the diameter of the first through holes 311 is, the more concentrated the stress around the first through holes 311 is. The larger the diameter of the first through holes 311 is, the greater the deflection of the cracks toward the first through holes 311 is. As the diameter of the first through holes 311 increases, the effect of the wire 21 in suppressing cracks gradually increases. That is, the first through holes 311 perpendicular to the wire 21 can disperse a larger stress and reduce an average stress. The smaller the diameter of the first through holes 311 is, the more the stress of the conductive layer 2 can be dispersed, but the more concentrated the stress around the first through holes 311 is. The larger the diameter of the first through holes 311 is, the more the crack propagation can be suppressed, but the worse the stress dispersion effect of the conductive layer 2 or even the conductive film 100 is. Therefore, in practical applications, comprehensive consideration is required to determine the diameter of the first through holes 311.

As shown in Table 1, an impedance change rate of the wire (straight line without holes) of the prior art before and after bending is 5.33%. An impedance change rate of the wire 21 (single row of holes) of Embodiment 1 before and after bending is 4.21%<5.33%. For the wire (straight line without holes) of the prior art, the number of bends before breaking is 150. For the wire 21 (single row of holes) of Embodiment 1, the number of bends before breaking is 166>150. Accordingly, compared with the prior art, the wire 21 of this embodiment has a smaller impedance change rate and a better fatigue resistance.

TABLE 1

| Type | Width | Impedance/Ω Before | After | Change rate | Number of bends before breaking | Stress concentration effect simulation |
|---|---|---|---|---|---|---|
| Embodiment 1 | 12 | 125.71 | 131.00 | 4.21% | 166 | 4.5% |
| Prior art | 5.4 | 121.82 | 128.32 | 5.33% | 150 | 2.06% |

Embodiment 2

Figure 3:
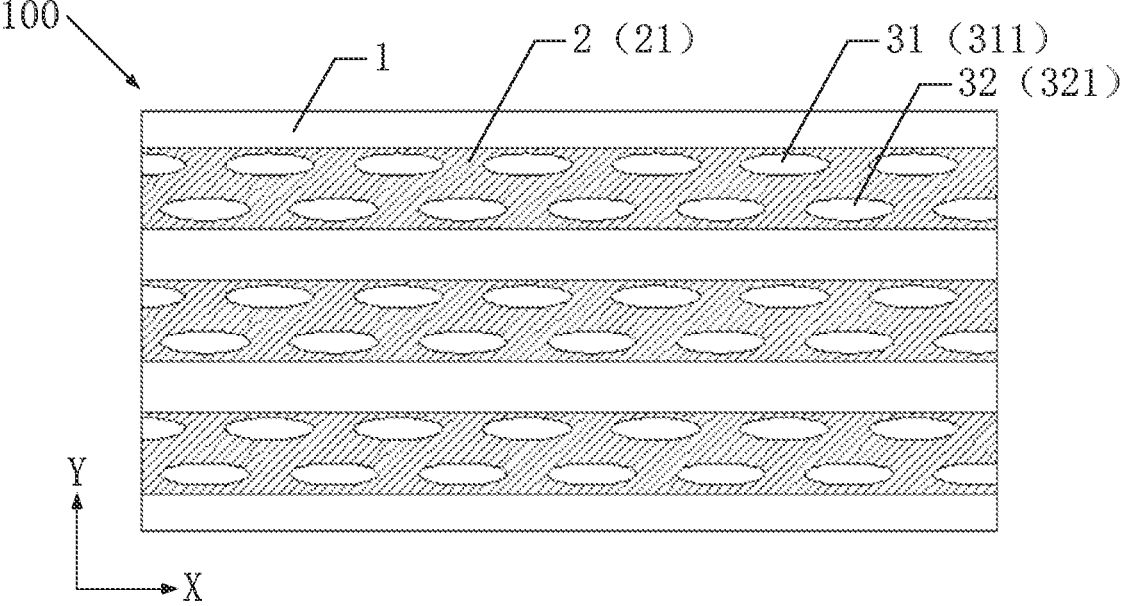
FIG. 3 is a schematic plan view of a conductive film according to Embodiment 2 of the present disclosure.

As shown in FIG. 3, this embodiment comprises most of technical features of Embodiment 1. This embodiment differs from Embodiment 1 in that the stress dispersing structure 3 of this embodiment further comprises a second stress dispersing structure 32. The second stress dispersing structure 32 comprises a plurality of second through holes 321 arranged at intervals in the extending direction (the X direction) of the wires 21 and vertically penetrating the at least one of the wires 21. In this embodiment, the projected shape of each of the first through holes 311 on the substrate 1 is an ellipse, and a projected shape of each of the second through holes 321 on the substrate 1 is an ellipse. The first through holes 311 and the second through holes 321 are staggered.

The stress dispersing structure 3 disperses the stress generated when the conductive film 100 is bent, which prevents cracks in the wires 21, inhibits spread of cracks, improves bending resistance of the conductive film 100, and prolongs a service life of the conductive film 100.

As shown in Table 2, the impedance change rate of the wire (straight line without holes) of the prior art before and after bending is 5.33%. The impedance change rate of the wire 21 (single row of holes) of Embodiment 1 before and after bending is 4.21%<5.33%. An impedance change rate of the wire 21 (first type of double row of holes) of Embodiment 2 before and after bending is 4.67%>4.21%. For the wire (straight line without holes) of the prior art, the number of bends before breaking is 150. For the wire 21 (single row of holes) of Embodiment 1, the number of bends before breaking is 166>150. For the wire 21 (first type of double row of holes Embodiment 2, the number of bends before breaking is 309>166. Accordingly, compared with the prior art, the wire 21 of this embodiment has a smaller impedance change rate and a better fatigue resistance. Compared with Embodiment 1, the wire 21 of this embodiment has a smaller impedance change rate and a better fatigue resistance.

dispersing structure 32. The second stress dispersing structure 32 comprises a plurality of second through holes 321 arranged at intervals in the extending direction (the X direction) of the wires 21 and vertically penetrating the at least one of the wires 21. In this embodiment, the projected shape of each of the first through holes 311 on the substrate 1 is a rounded triangle, and a projected shape of each of the second through holes 321 on the substrate 1 is a rounded triangle. The first through holes 311 and the second through holes 321 are staggered. In this embodiment, a projection of the first through holes 311 on the substrate 1 is centrally symmetric with a projection of the second through holes 321 on the substrate 1.

The stress dispersing structure 3 disperses the stress generated when the conductive film 100 is bent, which prevents cracks in the wires 21, inhibits spread of cracks, improves bending resistance of the conductive film 100, and prolongs a service life of the conductive film 100.

As shown in Table 3, the impedance change rate of the wire (straight line without holes) of the prior art before and after bending is 5.33%. The impedance change rate of the wire 21 (single row of holes) of Embodiment 1 before and after bending is 4.21%<5.33%. An impedance change rate of the wire 21 (second type of double row of holes) of Embodiment 3 before and after bending is 4.73%>4.67%. For the wire (straight line without holes) of the prior art, the number of bends before breaking is 150. For the wire 21 (single row of holes) of Embodiment 1, the number of bends before breaking is 166>150. For the wire 21 (first type of double row of holes) of Embodiment 2, the number of bends before breaking is 309>166. For the wire 21 (second type of double row of holes) of Embodiment 3, the number of bends before breaking is 350>309. Accord-

TABLE 2

| Type | Width | Impedance/Ω Before | After | Change rate | Number of bends before breaking | Stress concentration effect simulation |
|---|---|---|---|---|---|---|
| Embodiment 2 | 12 | 72.58 | 75.97 | 4.67% | 309 | / |
| Embodiment 1 | 12 | 125.71 | 131.00 | 4.21% | 166 | 4.5% |
| Prior art | 5.4 | 121.82 | 128.32 | 5.33% | 150 | 2.06% |

Embodiment 3

Figure 4:
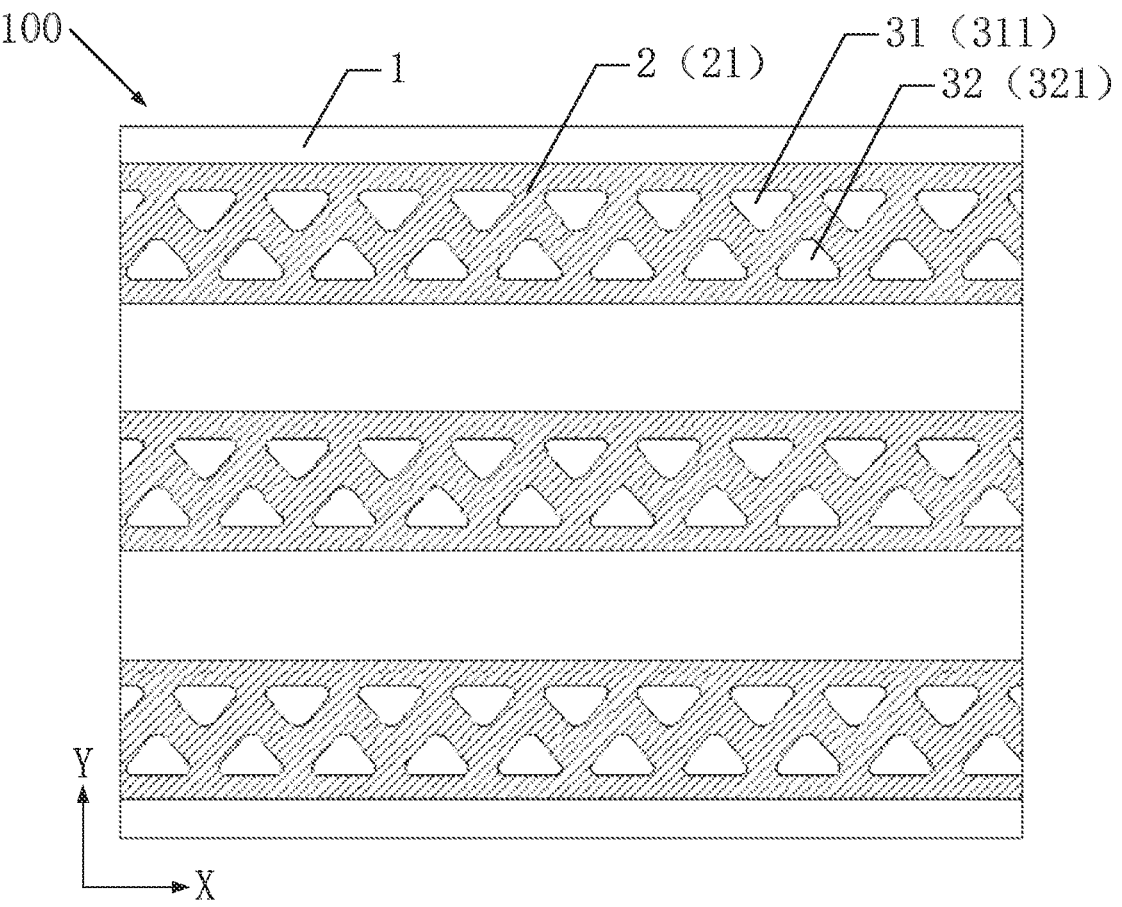
FIG. 4 is a schematic plan view of a conductive film according to Embodiment 3 of the present disclosure.

As shown in FIG. 4, this embodiment comprises most of technical features of Embodiment 1. This embodiment differs from Embodiment 1 in that the stress dispersing structure 3 of this embodiment further comprises a second stress ingly, compared with the prior art, the wire 21 of this embodiment has a smaller impedance change rate and a better fatigue resistance. Compared with Embodiment 1, the wire 21 of this embodiment has a smaller impedance change rate and a better fatigue resistance. Compared with Embodiment 2, the wire 21 of this embodiment has a smaller impedance change rate and a better fatigue resistance.

TABLE 3

| | | Impedance/Ω | | Change | Number of bends before | Stress concentration |
| Type | Width | Before | After | rate | breaking | effect simulation |
| --- | --- | --- | --- | --- | --- | --- |
| Embodiment 3 | 12 | 73.84 | 77.33 | 4.73% | 350 | 4.4% |
| Embodiment 2 | 12 | 72.58 | 75.97 | 4.67% | 309 | / |
| Embodiment 1 | 12 | 125.71 | 131.00 | 4.21% | 166 | 4.5% |
| Prior art | 5.4 | 121.82 | 128.32 | 5.33% | 150 | 2.06% |

Embodiment 4

Figure 5:
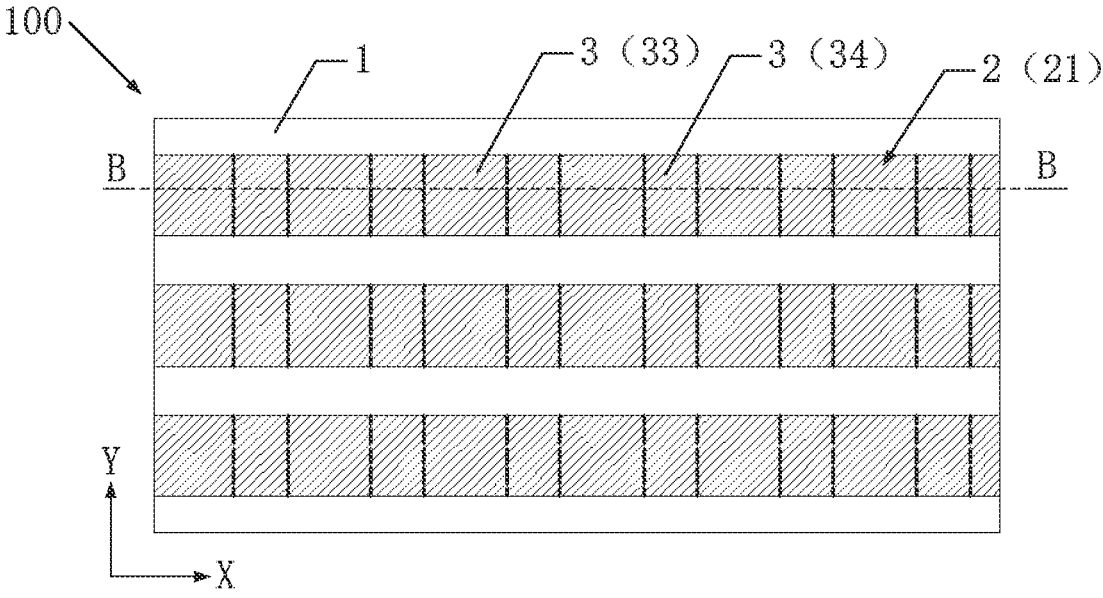
FIG. 5 is a schematic plan view of a conductive film according to Embodiment 4 of the present disclosure.
Figure 6:
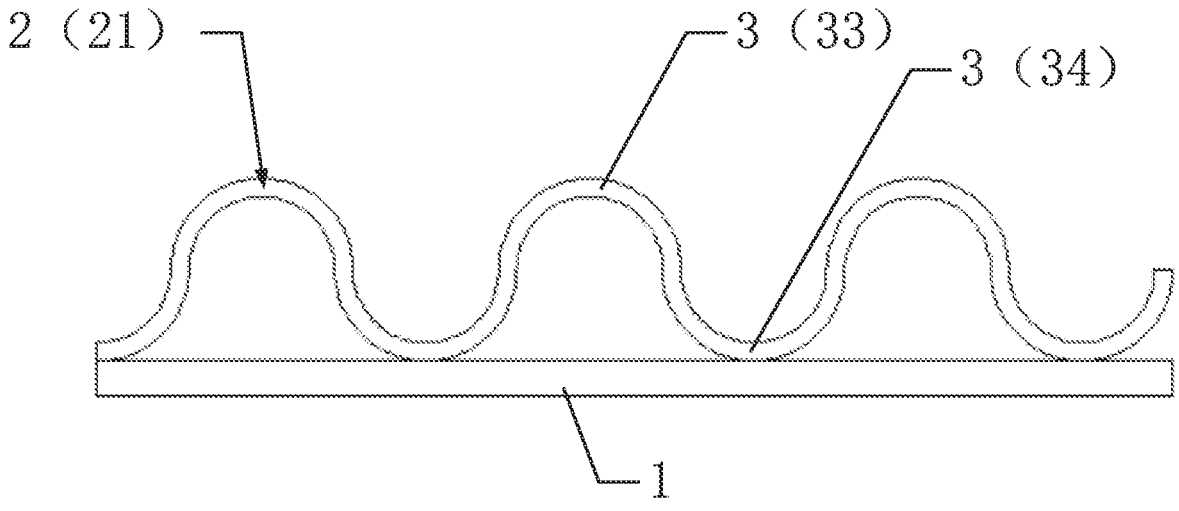
FIG. 6 is a cross-sectional schematic diagram of one wire of Embodiment 4 of FIG. 5 along a line B-B.

As shown in FIG. 5 and FIG. 6, this embodiment comprises most of technical features of Embodiment 1. This embodiment differs from Embodiment 1 in that a surface of each of the wires 21 of this embodiment facing the substrate 1 is a curved surface, and the stress dispersing structure 3 of this embodiment comprises a plurality of upper convex parts 33 and a plurality of lower concave parts 34 connected end to end.

The stress dispersing structure 3 disperses the stress generated when the conductive film 100 is bent, which prevents cracks in the wires 21, inhibits spread of cracks, improves bending resistance of the conductive film 100, and prolongs a service life of the conductive film 100.

Figure 7:
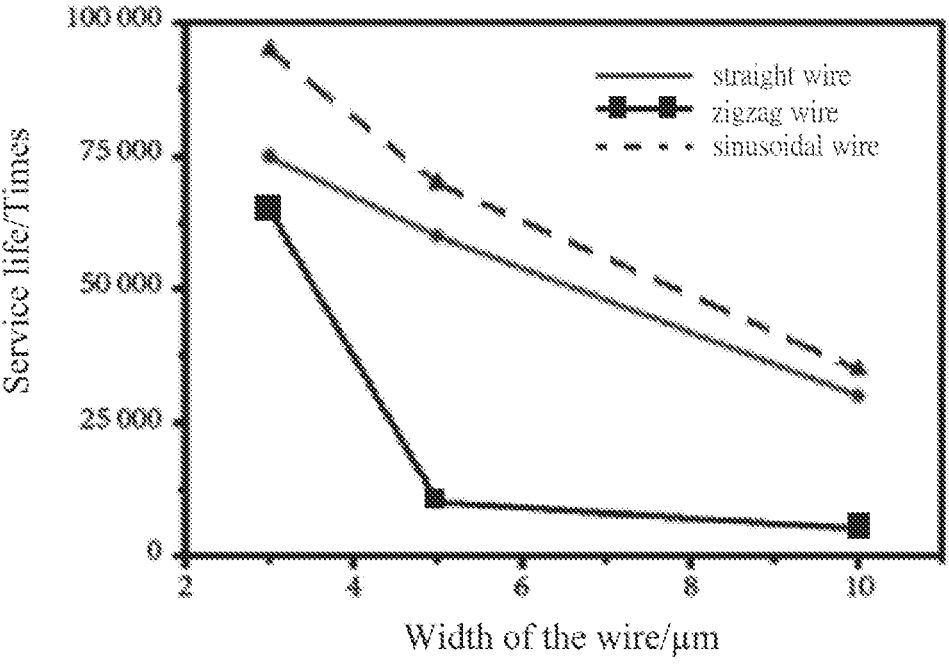
FIG. 7 is a graph showing a relationship between a bending life of each wire and a width of the wire.

As shown in FIG. 7, after a stress simulation by the simulation system, it can be found that a stress of a zigzag wire in a bending test is concentrated at corners of the zigzag wire, which cannot be released, resulting in fracture of a conductive layer. For a straight wire and a sinusoidal wire, internal stress generated by the straight wire and the sinusoidal wire can be evenly distributed at any position of the straight wire and the sinusoidal wire, which reduces a maximum stress in a film and suppresses stress concentration. Therefore, the straight wire and the sinusoidal wire can withstand more bending times in a bending process and have a longer service life. A flexural life of the zigzag wire is the lowest, and a flexural life of the sinusoidal wire is the highest.

As shown in FIG. 7, after the stress simulation by the simulation system, it can also be found that the larger the width of the wire 21, the greater the maximum stress, the greater the possibility of defects and micro-cracks appearing in the wire 21, the easier the cracks are to expand, the easier the wire 21 is to fail, and the worse the fatigue resistance. The smaller the width of the wire 21, the smaller the area in contact with an interface, the less the wire 21 is affected by a shear force of the interface in a bending process, the less likely the wire 21 is to fail, and the less likely the wire 21 has cracks.

As shown in Table 4, the impedance change rate of the wire (straight line without holes) of the prior art before and after bending is 5.33%. The impedance change rate of the wire 21 (single row of holes) of Embodiment 1 before and after bending is 4.21%<5.33%. An impedance change rate of the wire 21 (first type of double row of holes) of Embodiment 2 before and after bending is 4.67%>4.21%. An impedance change rate of the wire 21 (second type of double row of holes) of Embodiment 3 before and after bending is 4.73%>4.67%. An impedance change rate of the wire 21 (curved surface) of Embodiment 4 before and after bending is 1.88%<4.73%. For the wire (straight line without holes) of the prior art, the number of bends before breaking is 150. For the wire 21 (single row of holes) of Embodiment 1, the number of bends before breaking is 166>150. For the wire 21 (first type of double row of holes) of Embodiment 2, the number of bends before breaking is 309>166. For the wire 21 (second type of double row of holes) of Embodiment 3, the number of bends before breaking is 350>309. For the wire 21 (curved surface) of Embodiment 4, the number of bends before breaking is 433>350. Accordingly, compared with the prior art, the wire 21 of this embodiment has a smaller impedance change rate and a better fatigue resistance. Compared with Embodiment 1, the wire 21 of this embodiment has a smaller impedance change rate and a better fatigue resistance. Compared with Embodiment 2, the wire 21 of this embodiment has a smaller impedance change rate and a better fatigue resistance. Compared with Embodiment 3, the wire 21 of this embodiment has a smaller impedance change rate and a better fatigue resistance.

TABLE 4

| | | Impedance/Ω | | Change | Number of bends before | Stress concentration |
| Type | Width | Before | After | rate | breaking | effect simulation |
| --- | --- | --- | --- | --- | --- | --- |
| Embodiment 4 | 7.4 | 94.94 | 96.72 | 1.88% | 433 | 4.64% |
| Embodiment 3 | 12 | 73.84 | 77.33 | 4.73% | 350 | 4.4% |
| Embodiment 2 | 12 | 72.58 | 75.97 | 4.67% | 309 | / |
| Embodiment 1 | 12 | 125.71 | 131.00 | 4.21% | 166 | 4.5% |
| Prior art | 5.4 | 121.82 | 128.32 | 5.33% | 150 | 2.06% |

The conductive film and the display panel provided by the present disclosure are described in detail above. The present disclosure uses specific examples to describe principles and embodiments of the present invention. The above description of the embodiments is only for helping to understand the solutions of the present disclosure and its core ideas. Furthermore, those skilled in the art may make modifications to the specific embodiments and applications according to ideas of the present invention. In conclusion, the present specification should not be construed as a limitation to the present invention.

What is claimed is:

1. A conductive film, comprising:
   a substrate; and
   a conductive layer disposed on the substrate and comprising a plurality of wires spaced apart and parallel to each other, wherein at least one of the wires is provided with a stress dispersing structure, and the stress dispersing structure is configured to disperse a stress generated when the conductive film is bent;
   wherein a surface of each of the wires facing the substrate is a curved surface.

2. The conductive film according to claim 1, wherein the stress dispersing structure comprises:
   a first stress dispersing structure comprising a plurality of first through holes which are arranged at intervals in an extending direction of the wires and vertically penetrate the at least one of the wires.

3. The conductive film according to claim 2, wherein the stress dispersing structure further comprises:
   a second stress dispersing structure comprising a plurality of second through holes which are arranged at intervals in the extending direction of the wires and vertically penetrate the at least one of the wires.

4. The conductive film according to claim 3, wherein the first through holes and the second through holes are staggered.

5. The conductive film according to claim 3, wherein a projected shape of each of the first through holes and the second through holes on the substrate is an ellipse, a circle, a rounded triangle, or a rounded rectangle.

6. The conductive film according to claim 1, wherein the stress dispersing structure comprises a plurality of upper convex parts and a plurality of lower concave parts connected end to end.

7. The conductive film according to claim 1, further comprising:
   a protective layer disposed on a surface of the conductive layer away from the substrate.

8. The conductive film according to claim 7, wherein the protective layer comprises a first protective layer and a second protective layer, the first protective layer is disposed on the surface of the conductive layer away from the substrate, and the second protective layer is disposed on a surface of the first protective layer away from the substrate.

9. The conductive film according to claim 7, wherein a material of the first protective layer is Sn.

10. The conductive film according to claim 7, wherein a material of the second protective layer is a waterproof coating.

11. The conductive film according to claim 1, wherein a material of the substrate is selected from one or more of glass, polyimide, polycarbonate, polyethylene terephthalate, and polyethylene naphthalate.

12. A display panel, comprising:
   a conductive film configured to electrically connect at least two subcomponents of the display panel and comprising:
   a substrate; and
   a conductive layer disposed on the substrate and comprising a plurality of wires spaced apart and parallel to each other, wherein at least one of the wires is provided with a stress dispersing structure, and the stress dispersing structure is configured to disperse a stress generated when the conductive film is bent;
   wherein a surface of each of the wires facing the substrate is a curved surface.

13. The display panel according to claim 12, wherein the stress dispersing structure comprises:
   a first stress dispersing structure comprising a plurality of first through holes which are arranged at intervals in an extending direction of the wires and vertically penetrate the at least one of the wires.

14. The display panel according to claim 13, wherein the stress dispersing structure further comprises:
   a second stress dispersing structure comprising a plurality of second through holes which are arranged at intervals in the extending direction of the wires and vertically penetrate the at least one of the wires.

15. The display panel according to claim 14, wherein the first through holes and the second through holes are staggered.

16. The display panel according to claim 14, wherein a projected shape of each of the first through holes and the second through holes on the substrate is an ellipse, a circle, a rounded triangle, or a rounded rectangle.

17. The display panel according to claim 12, wherein the stress dispersing structure comprises a plurality of upper convex parts and a plurality of lower concave parts connected end to end.

18. The display panel according to claim 12, wherein the conductive film further comprises:
   a protective layer disposed on a surface of the conductive layer away from the substrate.

19. The display panel according to claim 12, wherein the conductive film is a chip on film (COF) or a flexible printed circuit (FPC).

\* \* \* \* \*